US009997664B2

United States Patent
Jun et al.

(10) Patent No.: US 9,997,664 B2
(45) Date of Patent: Jun. 12, 2018

(54) OPTICAL ELEMENTS AND ELECTRONIC DEVICES INCLUDING THE SAME

(71) Applicants: SAMSUNG ELECTRONICS CO., LTD., Suwon-si (KR); Bilkent University, Ankara (TR)

(72) Inventors: Shin Ae Jun, Seongnam-si (KR); Hilmi Volkan Demir, Ankara (TR); Eun Joo Jang, Suwon-si (KR); Burak Guzelturk, Ankara (TR); Can Uran, Ankara (TR); Talha Erdem, Ankara (TR); Kivanc Gungor, Ankara (KR)

(73) Assignees: SAMSUNG ELECTRONICS CO., LTD., Gyeonggi-Do (KR); BILKENT UNIVERSITY, Ankara (TR)

( * ) Notice: Subject to any disclaimer, the term of this patent is extended or adjusted under 35 U.S.C. 154(b) by 0 days. days.

(21) Appl. No.: 14/807,322

(22) Filed: Jul. 23, 2015

(65) Prior Publication Data
US 2016/0027963 A1    Jan. 28, 2016

(30) Foreign Application Priority Data
Jul. 25, 2014    (KR) .................. 10-2014-0095091

(51) Int. Cl.
*H01L 31/0352* (2006.01)
*G02B 6/02* (2006.01)
(Continued)

(52) U.S. Cl.
CPC ............ *H01L 33/06* (2013.01); *G02B 5/3025* (2013.01); *G02B 5/3058* (2013.01);
(Continued)

(58) Field of Classification Search
CPC ..... H01L 33/06; H01L 27/32; H01L 27/3244; H01L 2227/32; H01L 27/3241;
(Continued)

(56) References Cited

U.S. PATENT DOCUMENTS

| 7,768,018 B2 | 8/2010 | Smirnov et al. |
| 8,007,862 B2 | 8/2011 | Lee et al. |

(Continued)

FOREIGN PATENT DOCUMENTS

| DE | 102007033752 | 3/2008 |
| DE | 102012111693 | 6/2014 |

(Continued)

OTHER PUBLICATIONS

Peng, Formation of high-quality CdTe, CdSe, and CdS nanocrystals using CdO as precursor. J. Am. Chem. Soc. 2001, 123, pp. 183-184.*

(Continued)

*Primary Examiner* — Galina Yushina
(74) *Attorney, Agent, or Firm* — Cantor Colburn LLP

(57) ABSTRACT

An optical element includes a plurality of nanowires disposed in the form of an array and a light emitting material disposed on the nanowires, where the nanowires are longitudinally aligned in the array to linearly polarize at least a portion of light emitted from the light emitting material, and an electronic device includes the optical element.

30 Claims, 17 Drawing Sheets

(51) Int. Cl.
*G02B 5/30* (2006.01)
*H01L 33/06* (2010.01)
*H01L 51/50* (2006.01)
*H01L 51/52* (2006.01)
*B82Y 20/00* (2011.01)

(52) U.S. Cl.
CPC .... *G02B 6/0229* (2013.01); *H01L 31/035209* (2013.01); *H01L 51/502* (2013.01); *H01L 51/5293* (2013.01); *B82Y 20/00* (2013.01); *H01L 2251/5384* (2013.01)

(58) Field of Classification Search
CPC ........... H01L 31/035209; H01L 51/502; H01L 27/3232; G02B 5/3058; G02B 6/0229; G02B 6/0056; G02B 6/276; G02B 5/3025; G02B 27/026; G02F 1/1336
See application file for complete search history.

(56) References Cited

U.S. PATENT DOCUMENTS

| | | | | |
|---|---|---|---|---|
| 2005/0135079 A1* | 6/2005 | Yin Chua | ............... | B82Y 10/00 362/12 |
| 2008/0145568 A1* | 6/2008 | Lee | ..................... | C23C 18/1608 427/595 |
| 2008/0252825 A1* | 10/2008 | Kim | ....................... | B82Y 20/00 349/96 |
| 2009/0134486 A1* | 5/2009 | Fujikata | .............. | H01L 31/1085 257/449 |
| 2011/0261455 A1* | 10/2011 | Sugita | .................. | G02B 5/3058 359/485.05 |
| 2012/0206805 A1 | 8/2012 | Meng et al. | | |
| 2012/0287507 A1 | 11/2012 | Lee et al. | | |
| 2012/0293748 A1* | 11/2012 | Jung | .................. | G02F 1/133528 349/69 |
| 2013/0182405 A1 | 7/2013 | Kaufman | | |
| 2014/0027738 A1 | 1/2014 | Lee | | |
| 2014/0254011 A1* | 9/2014 | McCarthy | ............ | G02B 5/3058 359/485.05 |
| 2015/0041302 A1* | 2/2015 | Okumura | ................ | G06F 3/044 200/600 |

FOREIGN PATENT DOCUMENTS

| | | |
|---|---|---|
| EP | 1792872 | 6/2007 |
| WO | 2008147431 | 12/2008 |
| WO | 2012059931 | 5/2012 |

OTHER PUBLICATIONS

Scholz, Optical Constants of Silver, Gold, Copper, and Auminum. II. The Index of Refaction. Journal of the Optical Society of Ameria, vol. 44, No. 5, 1954, pp. 362-368.*

Can Uran, et al., "Highly polarized light emission by isotropic quantum dots integrated with magnetically aligned segmented nanowires", Applied Physics Letters, vol. 105, (2014), pp. 141116-141116-4.

European Search Report-European Patent Application No. 15178071.5 dated Dec. 16, 2015, citing the enumerated references listed above.

* cited by examiner (a) (b) (c)

OPTICAL ELEMENTS AND ELECTRONIC DEVICES INCLUDING THE SAME

CROSS-REFERENCE TO RELATED APPLICATION

This application claims priority to Korean Patent Application No. 10-2014-0095091 filed on Jul. 25, 2014, and all the benefits accruing therefrom under 35 U.S.C. §119, the content of which is incorporated herein in its entirety by reference.

BACKGROUND

1. Field

Embodiments of an optical element and an electronic device including the optical element are disclosed.

2. Description of the Related Art

A Liquid Crystal Display ("LCD") is a non-emissive type of display including an external light source to display an image. A backlight unit disposed at the back of the LCD panel typically emits white light, which is a randomly polarized light. The white light passes through a polarizer and is thereby converted to polarized light, which passes through a liquid crystal layer, a color filter and another polarizer, and finally provides image information to a user. The light from the backlight unit including a light emitting diode or a cold cathode fluorescent lamp passes through a plurality of optical layers disposed within the liquid crystal display and finally has light intensity that is decreased to only about 2% to about 8% of its original intensity. Therefore, its optical efficiency is very low. Among the plurality of optical layers included in the LCD, the polarizer is an element causing the greatest optical loss and thus various research has been underway in an effort to minimize the optical loss resulting from the polarizer. For example, a reflective polarizer (e.g., a wire grid polarizer) has been suggested instead of the absorption type polarizer. The reflective polarizer may transmit light having a predetermined polarized direction while it may reflect light having another polarized direction and reuse the reflected light. Therefore, the reflective polarizer may have a relatively high polarization ratio. However, the production of the wire grid polarizer typically uses special nanolithography technologies such as focused ion beam lithography, electron beam lithography or nanoimprint lithography, for example, which entail expensive equipment and very high precision, and have low productivity due to the long production time thereof. In addition, a wire grid having a desired pattern may not be effectively provided.

Therefore, it is still desired to develop a technology for reducing the light loss from the light source, such as a backlight unit, to enhance optical efficiency of a display device such as an LCD.

SUMMARY

An embodiment provides an optical element that may enhance the optical efficiency of the light emitted from a light source.

Another embodiment provides an electronic device including the optical element.

In an embodiment of the invention, an optical element includes: a plurality of nanowires disposed in the form of an array; and a light emitting material disposed on the nanowires, where the nanowires are longitudinally aligned in the array to linearly polarize at least a portion of light being emitted from the light emitting material.

In an embodiment, the optical element may further include a transparent substrate, where the nanowires are disposed on the transparent substrate.

In an embodiment, the transparent substrate may be flexible.

In an embodiment, the nanowires may include a magnetic nanowire.

In an embodiment, the magnetic nanowires may include a first segment having magnetism and a second segment capable of causing surface plasmon resonance. In such an embodiment, the first segment and the second segment may include different metals from each other.

In an embodiment, the first segment may include nickel, cobalt, iron, oxidized iron or a combination thereof, and the second segment may include gold, silver, copper, platinum or a combination thereof.

In an embodiment, the nanowire may have a diameter of less than or equal to about 300 nanometers (nm) and an aspect ratio of greater than or equal to about 10.

In an embodiment, the array of the nanowires may have a single layer structure or a multi-layer structure.

In an embodiment, the light emitting material may include a quantum dot, a nano-sized inorganic phosphor, an organic dye, or a combination thereof.

In an embodiment, the quantum dot may have a diameter of about 2 nm to about 10 nm, where the quantum dot may absorb light having a wavelength between about 300 nm to about 700 nm and emit light having a wavelength between about 400 nm to 700 nm.

In an embodiment, the light emitting material may absorb light having a wavelength between about 300 nm to about 650 nm and emit light having a wavelength between about 450 nm to 660 nm.

In an embodiment, the light emitting material may be coated with a polymer or a metal oxide.

In an embodiment, the light emitting material may include a quantum dot including a Group II-VI compound, a Group III-V compound, a Group IV-VI compound, a Group IV element or compound, or a combination thereof.

In an embodiment, the light emitting material may have a core-shell structure.

In an embodiment, the optical element may include a first layer and a second layer contacting a surface of the first layer, the first layer may include a first host matrix and the array of nanowires dispersed in the first host matrix, and the second layer may include a second host matrix and the light emitting material dispersed in the second host matrix.

In an embodiment, the optical element may include a single layer including the array of the nanowires and the light emitting material dispersed in a single host matrix.

In an embodiment, the first and second host matrix or the single host matrix may include a transparent polymer.

In an embodiment, the light emitting material may be disposed adjacent to the array of the nanowires such that at least a portion of the light emitted from the light emitting material may be coupled with surface plasmons of the nanowires.

In an embodiment, the amount of the nanowires may be about 1 to about 10 parts by weight per $10^5$ parts by weight of the light emitting material.

In another embodiment, an electronic device includes a light source which emits light, and an optical element which receives the light from the light source, where the optical element includes a plurality of nanowires disposed in the form of an array, and a light emitting material disposed on the nanowires, and the nanowires are longitudinally aligned in the array to linearly polarize at least a portion of light emitted from the light emitting material.

In an embodiment, the optical element may receive the light from the light source such that the light emitted from the light source having a first wavelength excites the light emitting material to emit light having a second wavelength, and the light having the second wavelength passes through the array of the nanowires and is linearly polarized.

In an embodiment, the nanowires may include a first segment having magnetism and a second segment capable of causing surface plasmon resonance.

In an embodiment, the first segment may include nickel, cobalt, iron, oxidized iron or a combination thereof, and the second segment may include gold, silver, copper, platinum or a combination thereof.

In an embodiment, the nanowire may have a diameter of less than or equal to about 300 nm and an aspect ratio of greater than or equal to about 10.

In an embodiment, the array of the nanowires may have a single layer structure or a multi-layer structure.

In an embodiment, the light emitting material may include a semiconductor nanocrystal, and the light emitting material may include a Group II-VI compound, a Group III-V compound, a Group IV-VI compound, a Group IV compound or a combination thereof and have a core-shell structure.

In an embodiment, the optical element may have a first layer and a second layer contacting a surface of the first layer, the first layer may include a first host matrix and the array of the nanowires dispersed in the first host matrix, and the second layer may include a second host matrix and the light emitting material dispersed in the second host matrix.

In an embodiment, the optical element may include a single layer including the array of the nanowires and the light emitting material dispersed in a single host matrix.

In an embodiment, the electronic device may be a light emitting diode ("LED"), an organic light emitting diode ("OLED"), a sensor, a solar cell electronic device, or a liquid crystal display ("LCD").

Embodiments of the optical element according to the invention as described herein have a light emitting and polarizing nanostructure including an array of nanowires and a light emitting material such as quantum dots, and thus may emit light that is polarized in a desired direction prior to passing a polarizer. Therefore, in a non-emissive display such as a LCD, the optical loss due to polarizing light by a polarizer may be improved, and the light emitting efficiency of the light emitting material may be enhanced. Such embodiments of the optical element may allow a non-emissive display such as an LCD to operate without a polarizer or with a reduced number of polarizers.

BRIEF DESCRIPTION OF THE DRAWINGS

These and/or other features will become apparent and more readily appreciated from the following description of embodiments, taken in conjunction with the accompanying drawings, in which.

DETAILED DESCRIPTION

Figure 1A:
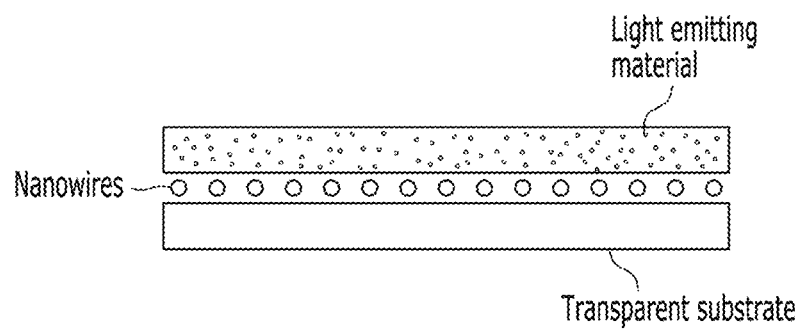
FIG. 1A is a view schematically showing an embodiment of an optical element according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" as used herein refers to a monovalent or a higher valency group derived from a straight or branched chain saturated aliphatic hydrocarbon, and having a specified number of carbon atoms.

"Aryl" as used herein refers to a monovalent or a higher valency group derived from a cyclic moiety in which all ring members are carbon and at least one ring is aromatic, and having a specified number of carbon atoms.

Hereinafter, embodiments of the invention will be described in further detail with reference to the accompanying drawings.

FIG. 1A is a view schematically showing an embodiment of an optical element according to the invention.

In an embodiment, an optical element includes: a plurality of nanowires (e.g., metal nanowires) disposed in the form of an array; and a light emitting material disposed on the nanowires, where the nanowires are longitudinally aligned in the array to linearly polarize at least a portion of light emitted from the light emitting material.

As used herein, the term "nanowires longitudinally aligned" refers to nanowires arranged substantially in parallel to a longitudinal axis (e.g., an axis perpendicular to the cross-section) of each nanowire. Therefore, in an embodiment, a plurality of the nanowires longitudinally aligned may not contact with each other over their entire length. As used herein, the term "linearly polarized" means that the electric field component of the electromagnetic wave (e.g., light) is constrained to oscillate in a single plane orthogonal to the propagation direction thereof. As used herein, the term "aspect ratio" of a nanowire refers to a value obtained by dividing the length of the nanowire with the diameter thereof (i.e., the length/diameter ratio).

In an embodiment, the light emitting material may emit unpolarized light. When the unpolarized light reaches the array of the nanowires, the light having an electric field oscillating perpendicular to the aligned direction of the nanowires passes the nanowire array, while the other light fails to pass the nanowire array such that at least some of the light failing to pass the nanowire array may be reflected. In such an embodiment, the array of the aligned nanowires may function as a forward scatterer, and thus the polarized light in a direction perpendicular to the alignment may be transmitted while the polarized light in a direction parallel to the alignment is absorbed or back scattered. The light being reflected or scattered may be used again, that is, recycled, as an excitation source for the light emitting material. Accordingly, in an embodiment, where the light emitted from the light emitting material is unpolarized light, the light emitted from the optical element may emit predominantly polarized light (for example, perpendicular to the aligned direction of the nanowire array). In an embodiment, the optical element may have a degree of polarization (P) defined by Equation 1, which is greater than or equal to about 0.3, or for example, greater than or equal to about 0.6.

$$P=(\text{intensity of }s\text{-polarization}-\text{intensity of }p\text{-polarization})/(\text{intensity of }s\text{-polarization}+\text{intensity of }p\text{-polarization}) \quad \text{Equation 1:}$$

In Equation 1, intensity of s-polarization refers to intensity of transmitted light having an electric field oscillating in a direction perpendicular to the aligned direction of the nanowires (i.e., the longitudinal direction of the nanowires), and intensity of p-polarization refers to intensity of transmitted light having an electric field oscillating in a direction parallel to the aligned direction of the nanowires.

The optical element may be a free standing film. Alternatively, the optical element may further include a transparent substrate, where the nanowires are disposed on the transparent substrate. Materials of the transparent substrate are not particularly limited and may be selected to appropriately. In one embodiment, for example, the transparent substrate may include a polymer such as a polyimide, an acrylic polymer, a polyethylene, a polypropylene, a polystyrene or polyvinylpyrrolidone ("PVP"), an inorganic material such as glass and quartz, an indium tin oxide, a tin oxide, a zinc oxide or a titanium oxide, or a combination thereof, but is not limited thereto. The transparent substrate may be a flexible substrate, e.g., a substrate having a Young's modulus (i.e., a tensile modulus) in a range of about 0.001 to about 5 gigaPascals (GPa), in a range of about 0.01 to about 1 GPa, or in a range of about 0.05 to about 0.5 GPa.

Figure 1B:
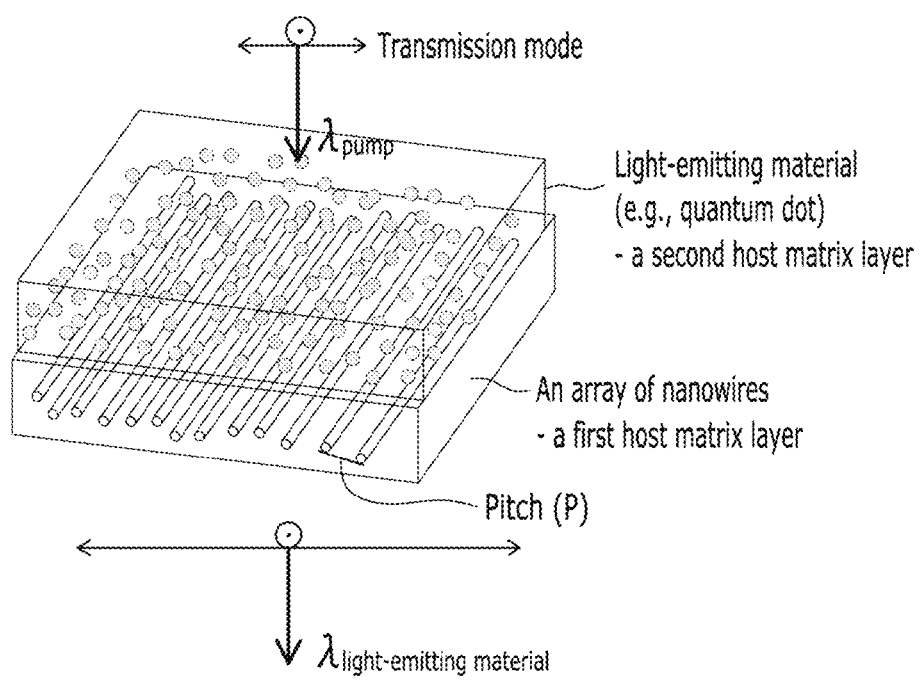
FIG. 1B is a view schematically illustrating a structure of an embodiment of an optical element in accordance with the invention.

FIG. 1B is a view schematically illustrating a structure of an embodiment of an optical element according to the invention.

In an embodiment, an optical element includes a first layer including a plurality of nanowires disposed in the form of an array (e.g., an array of nanowires), and a second layer including a light-emitting material and disposed on the first layer, where the nanowires are longitudinally aligned (e.g., longitudinal axes of the nanowires are aligned in a predetermined direction) in the array to linearly polarize at least a portion of light emitted from the light emitting material. In such an embodiment, the first layer may further include a first host matrix, in which the nanowires are disposed, and the second layer may further include a second host matrix, in which the light emitting material is disposed. Referring to FIG. 1, when light having a wavelength $\lambda_{pump}$ is emitted from a light source to the optical element, the light passes the second layer including the light-emitting material (e.g., quantum dots) in the second matrix (e.g., polyvinylpyrrolidone), and the first layer including the nanowires (e.g., metal nanowires), and is thereby converted to light having a wavelength $\lambda_{light\ emitting\ material}$, which may be determined based on the light-emitting material, and emitted from the optical element.

In such an embodiment, the distance between two adjacent nanowires in the array of the nanowires (hereinafter, a pitch) may be less than or equal to about 62% (for example, less than or equal to about 61%, less than or equal to about 54%, less than or equal to about 50%, less than or equal to about 47%, or less than or equal to about 40%) of the maximum peak wavelength of the light emitted from the light-emitting material. In such an embodiment, where the pitch of the array is less than or equal to about 62% of the maximum peak wavelength of the light emitted from the light-emitting material, the light emitted from the light emitting material may be efficiently linearly polarized.

In an embodiment, the average diameter of the nanowires may be less than or equal to about 300 nanometers (nm), for example, less than or equal to about 280 nm, less than or equal to about 260 nm, less than or equal to about 200 nm, less than or equal to about 150 nm, or less than or equal to about 100 nm. The average diameter of the nanowire may be greater than or equal to about 2 nm, for example, greater than or equal to about 5 nm, or greater than or equal to about 10 nm, but it is not limited thereto. The average length of the nanowires is not particularly limited, and may be selected appropriately. In one embodiment, for example, the average length of the nanowires greater than or equal to about 3 micrometers (μm), for example, greater than or equal to about 5 μm, greater than or equal to about 8 μm, greater than or equal to about 9 μm, or greater than or equal to about 10 μm, but it is not limited thereto. In one embodiment, for example, the average length of the nanowires less than or equal to about 500 μm, or less than or equal to about 100 μm, but it is not limited thereto. The nanowires may have an average aspect ratio of greater than or equal to about 10, for example, greater than or equal to about 12, or greater than or equal to about 20.

In an embodiment, the nanowires may include a magnetic nanowire. In such an embodiment, the nanowires may be oriented under a magnetic field, such that the array of the nanowires that are aligned longitudinally may be effectively provided. In one embodiment, for example, the nanowires including ferromagnetic parts may be aligned under an externally applied magnetic field. The in-template synthesis of the nanowires together with their magnetic field assisted alignment allows a production of a massive number of highly parallel nanowires over large area thin films, such that the fabrication cost and time of the nanowire array may be substantially reduce. According to an embodiment, the magnetic field assisted assembly using centimeter-sized commercially available magnets may allow the nanowires to align without surface functionalization.

An externally applied magnetic field enables magnetization of the nanowires, and may rotate and position the nanowires along the direction of the applied field. Without being bound by any theory, high aspect ratio geometry of the nanowires, which allows the magnetic segment of the nanowires to experience higher magnetization and induce magnetic charges to interact with the external magnetic field, may allow effective movement of the nanowires. As a result, a torque is exerted on the north/south magnetic poles of the magnetized nanowires allow the magnetized nanowires to align in the direction of the field. Increasing the ferromagnetic segment length of the nanowires may improve efficiency of the alignment of the nanowires. In such an embodiment, increasing the external magnetic field may lead to a better alignment of the nanowires. Therefore, in such an embodiment, an array of the nanowires may be effectively obtained by controlling the length of the nanosegment and/or the intensity of the magnetic field.

Linear optical polarizers are passive components that selectively transmit a portion of the light defined by an electromagnetic field parallel to the transmission axis (s-polarization) and block the transmission of a portion of the light defined by the electromagnetic orthogonal to the transmission axis (p-polarization). Polarizers are widely used in various applications including imaging and in liquid crystal displays ("LCD"s). In an LCD, unpolarized light from the backlight unit is converted into polarized light through a polarizer. This process contributes to the most significant light loss of the LCDs. An embodiment of the invention provides a light source that emits highly polarized light, e.g., a thin film of nano-emitters including colloidal quantum dots coupled to the (e.g., magnetically) aligned segmented nanowires.

In an embodiment, the nanowires may include a nanowire having a single component. The nanowire of the single component may include nickel, gold, silver, copper, platinum, or a combination thereof (e.g., including an alloy).

In other embodiments, the nanowires may include a multi-segmented nanowire. As used herein, the term "multi-segmented nanowire" refers to a nanowire including at least two segments, wherein at least one segment includes a material different from the other segment(s). The nanowire may be selectively etched for an enhanced polarization effect and to reduce optical loss caused by the magnetic segment including a material such as nickel or iron.

Figure 2:
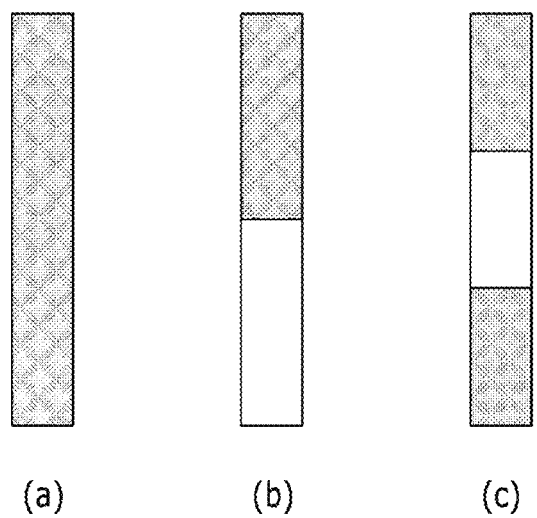
FIG. 2 is a view schematically illustrating structures of nanowires included in an embodiment of an optical element in accordance with the invention.

In an embodiment, the nanowires may include a multi-segmented magnetic nanowire. The multi-segmented magnetic nanowire may include a first segment having magnetism and a second segment capable of causing surface plasmon resonance. In FIG. 2, (*a*) to (*c*) schematically show embodiments of a nanowire according to the invention. As shown in FIG. 2 (*a*), an embodiment of the nanowires may include a nanowire having a single component such as nickel, iron, gold, silver, or the like. In such an embodiment, the nanowire may be a magnetic nanowire having a single component. As shown in FIG. 2 (b), an embodiment of the nanowires may include a multi-segmented nanowire having a metal segment having magnetism (i.e., a first segment, e.g., a nickel- or cobalt-containing segment) and a metal segment capable of causing surface plasmon resonance (i.e., a second segment, e.g., a gold- or silver-containing segment). As shown in FIG. 2 (c), an embodiment of the nanowires may include a multi-segmented nanowire that includes a first segment (e.g., a nickel or cobalt segment), a second segment (e.g., a gold or silver segment), and another first segment (e.g., a nickel or cobalt segment). However, FIG. 2 (a) to (c) show exemplary embodiments, and the nanowire may be variously modified to have other structures. In an embodiment, the alignment degree and the light emitting intensity may be adjusted by controlling the magnetic segment.

Such embodiments of the nanowires may be prepared by any known method. In one embodiment, for example, a nanowire may be prepared by conducting electro-deposition on a substrate as a nano-porous template. In such an embodiment, a plurality of nanowires may be prepared and the composition of each nanowire may be modulated to vary along with the length thereof. The template material maintains the nanowires to have a predetermined thickness, and nanowires to be perpendicular to the plane of the template. Using a template with many parallel nano-pores allows a number of nanowires to grow at the same time, and in this case, the pore diameter may be selected to obtain a desired diameter of the nanowire. In this method, the morphology of the template is controlled to realize mass-production of nanowires having desired properties. Materials of the template may be selected appropriately and are not particularly limited. In one embodiment, for example, the template may include a nano-channeled glass film, a porous alumina film formed via anode oxidation of aluminum, a mica film including tracks of etched nucleus particles, or a polycarbonate membrane. Such a template may be manufactured in any known method or commercially available.

In such an embodiment, where the nanowires are manufactured via electrodeposition, one side of the porous template may be coated with a metal layer, which may serve as a working electrode in a three-electrode deposition cell. The deposition may take place inside the nanopores, starting from the metal layer. Multi-segmented nanowires may be produced by either sequentially changing the deposition solution, or from single multi-reagent solutions by varying the deposition potential.

Preparation of the deposition solution and types of the reagent being used may depend on the composition of the nanowire to be fabricated. Details are known in the art, and the reagents are commercially available.

The template is dissolved to obtain nanowires therefrom, which then form a dispersion of nanowires. In one embodiment, for example, the polycarbonate may be dissolved in chloroform. Alumina may be dissolved in a (e.g., warm) potassium hydroxide or a sodium hydroxide solution, and mica may be dissolved in hydrofluoric acid. After conducting appropriate washing, the nanowires may be dispersed in various solvents (e.g., deionized water) by ultrasonic agitation. In case of manufacturing the multi-segmented nanowire, a post thermal baking process may be performed prior to the preparation of the nanowires to maintain the segmented nanowires robust and undamaged.

In case of manufacturing the magnetic nanowires, the magnetism of the nanowires may be tuned by controlling the composition of the nanowires. The magnetism may allow the nanowires to effectively align in a desired direction with a desired pitch under a given magnetic field.

In an embodiment, the array of the nanowires may have a single layer structure (e.g. a monolayer, see FIG. 1). Alternatively, the array of the nanowires may have a multi-layer structure, e.g., including at least two layers (see FIG. 13).

In an embodiment, the light emitting material may be disposed adjacent to the array of the nanowires. In such an embodiment, the light emitting material may be in a near-field coupling with surface plasmons of the nanowire via at least a portion of light emitted therefrom, such that the surface plasmon oscillation of the nanowires in the array may be coupled with the light emitted from an adjacent light emitting material (e.g., adjacent quantum dots), thereby inducing radiative rate enhancement. In such an embodiment, due to the near-field surface plasmon coupling between the light emitting materials and the nanowires, the light emitting material may have an improved radiative recombination rate, and thereby the intensity of the light being linearly polarized by the array of the nanowires may be substantially high.

Figure 12:
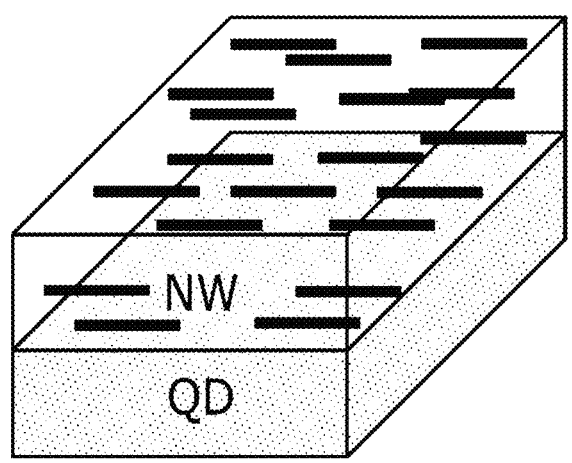

In an embodiment, the optical element may include the first layer and the second layer contacting a surface of the first layer (see FIG. 1 and FIG. 12). The first layer may include the first host matrix and the array of the nanowires dispersed in the first host matrix, and the second layer may include the second host matrix and the light emitting material dispersed in the second host matrix. The first host matrix and the second host matrix may include or be made of a same material as each other or different materials from each other. In an embodiment, the first or second host matrix may include a transparent polymer. In such an embodiment, the polymer may include a dielectric (e.g. insulative) polymer. In one embodiment, for example, the transparent polymer may be PVP, polystyrene, polyethylene, polyacrylate, polypropylene, polymethyl methacrylate ("PMMA"), poly(butyl methacrylate) ("PBMA"), a copolymer thereof, or a combination thereof. The first layer and the thickness of the second layer may have a predetermined thickness, but are not particularly limited. By controlling the thicknesses of the first and second layers, at least a portion of light emitted from the light emitting material may be coupled with the surface plasmon of the (magnetic) nanowires more easily. In an embodiment, the first or second host matrix may include a material that effectively prevents quenching of the emission of the light emitting material (e.g., quantum dots). In an embodiment, the host matrix may have an appropriate level of viscosity so that the nanowires are not pulled to the sides of the film while drying. In an embodiment, a host matrix including PVP has a suitable viscosity and this allows controlling the positioning of nanowires as required for a higher polarization ratio. Once it dries, PVP may serve as a strong host material to maintain the alignment of the nanowires and provide a three-dimensional structure where the nanowires are highly aligned along one dimension.

Figure 11:
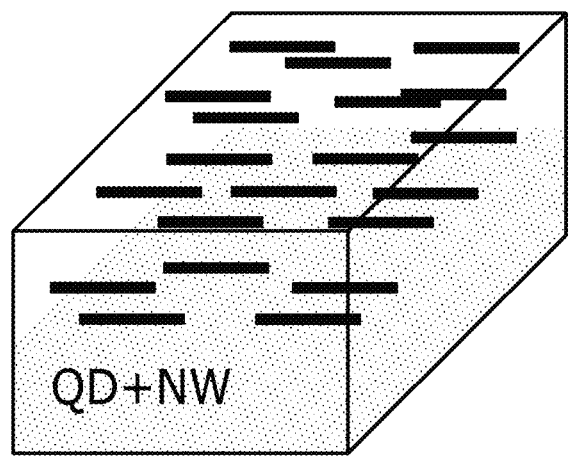
FIG. 11 and FIG. 12 are views schematically illustrating a structure of embodiments of an optical element according to the invention.

In another embodiment, the optical element may include a single layer including the array of the nanowires NW and the light emitting material (e.g., quantum dots QD) in a single host matrix (see FIG. 11). In such an embodiment, the single host matrix are substantially the same as the first and second matrices described above, and any repetitive detailed description thereof will be omitted or simplified. In one embodiment, for example, the host matrix may include a transparent polymer. In an embodiment, for example, the transparent polymer may be PVP, polystyrene, polyethylene, polyacrylate, PMMA, PBMA, a copolymer thereof, or a combination thereof.

In an embodiment, the amount of the nanowires may be about 1 to about 10 parts by weight per $10^5$ parts by weight of the light emitting material, but is not limited thereto.

Figure 1C:
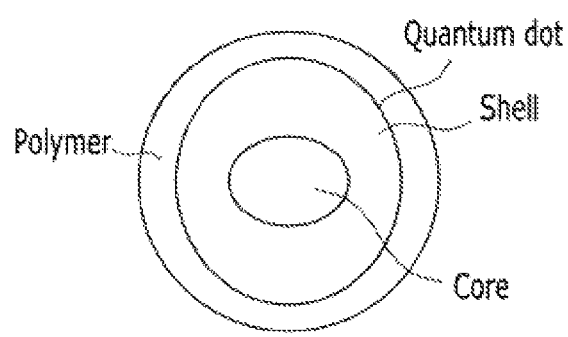
FIG. 1C is a view schematically illustrating a structure of a light emitting material included in an embodiment of an optical element in accordance with the invention.

FIG. 1C is a view schematically illustrating a structure of a light emitting material included in an embodiment of an optical element in accordance with the invention.

In an embodiment, the light emitting material may include a quantum dot, a nano-sized inorganic phosphor, an organic dye, or a combination thereof. The light emitting material may be an isotropic emitter. The light emitting material may be coated with a polymer having a carboxylate anion group (—COO$^-$), an amine group, a thiol group, or a combination thereof (e.g., a poly(meth)acrylate such as PMMA, PBMA, PVP, poly(ethylene-co-acrylic acid)); or a metal oxide (or a composite form thereof) such as silica, a titanium oxide, a zirconium oxide, a tin oxide, a zinc oxide or a vanadium oxide, or a combination of the polymer and the metal oxide. The light emitting material may absorb light in an ultraviolet ("UV") region or a visible region (e.g., having a wavelength between about 200 nm to about 700 nm) and emit light having a wavelength longer than that of the absorbed light (e.g., light corresponding to a blue, green, or red region). In one embodiment, for example, the quantum dot may absorb light having a wavelength in a range of about 300 nm to about 700 nm and emit light having a wavelength in a range of about 400 nm to 750 nm. The wavelength of the emitted light may be effectively controlled by varying the composition and the size of the quantum dots. In an embodiment, the quantum dots may have an average size (e.g., diameter) in a range of about 2 nm to about 30 nm, for example, in a range of 2 nm to 10 nm.

In an embodiment, the quantum dot may include a Group II-VI compound, a Group III-V compound, a Group IV-VI compound, a Group IV compound, or a combination thereof.

In an embodiment, the quantum dot may include a core including a first nanocrystal, and a shell disposed on (e.g., surrounding) the core and including a crystalline or amorphous material. The shell may be a multi-layered shell, each layer of which includes the same crystalline or amorphous material as each other, or different crystalline or amorphous materials from each other. The quantum dot may have pure emission color that may be effectively matched with the color filters of an LCD to enhance the optical performance of the LCD.

In such an embodiment, the first nanocrystal may include a Group II-VI compound, a Group III-V compound, a Group IV-VI compound, a Group IV compound, or a combination thereof. The crystalline or amorphous material of the shell may have the same composition as the first nanocrystal or may have different composition from the first nanocrystal. The crystalline or amorphous material may include a Group II-VI compound, a Group III-V compound, a Group IV-VI compound, a Group IV compound, or a combination thereof. The shell may include a material having a larger bandgap than that of the first nanocrystal.

In one embodiment, for example, the Group II-VI compound may include at least one selected from:

a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

In one embodiment, for example, the Group III-V compound semiconductor may include at least one selected from:

a binary element compound selected from GaN, GaP, GaAs, GaSb, AlN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

In one embodiment, for example, the Group IV-VI compound may include at least one selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

In one embodiment, for example, the Group IV compound may include at least one selected from:

singular element compound selected from Si, Ge, and a combination thereof; and a binary element compound selected from SiC, SiGe, and a combination thereof.

In one embodiment, for example, the quantum dots may have a quantum yield of greater than or equal to about 50%, for example, greater than or equal to about 70%. The quantum dots may have a full width at half maximum ("FWHM") of less than or equal to about 55 nm, for example, less than or equal to about 50 nm, or less than or equal to about 40 nm.

The shape of the nanocrystal is not particularly limited. In one embodiment, for example, the nanocrystal may have a spherical shape, a pyramidal shape, a multi-arm shape, or a cubic shape. The nanocrystal may be in the form of a nanoparticle, a nanotube, a nanowire, a nano-fiber, a nano-plate, or the like, for example.

In an embodiment, the quantum dots may be prepared by a wet chemical method and thus have a ligand compound surface-coordinated thereon. The ligand compound may be any of ligand compounds known in the art without particular limitation. In one embodiment, for example, the ligand compound may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH or a combination thereof, where R and R' are independently a C1 to C24 alkyl group, a C2 to C24 alkenyl group, or a C5 to C20 aryl group. The organic ligand compound may coordinate to the surface of the nanocrystals as prepared, playing a role in dispersing the nanocrystals uniformly in a solution, and maintaining the light-emitting and electrical characteristics of the nanocrystals. In one embodiment, for example, the organic ligand compound may include, but are not limited to, at least one selected from methanethiol, ethanethiol, propanethiol, butanethiol, pentanethiol, hexanethiol, octanethiol, dodecanethiol, hexadecanethiol, octadecanethiol, benzylthiol, methaneamine, ethaneamine, propaneamine, butaneamine, pentaneamine, hexaneamine, octanamine, dodecanamine, hexadecylamine, octadecylamine, dimethylamine, diethylamine, dipropylamine, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, a phosphine such as methylphosphine, ethylphosphine, propylphosphine, butylphosphine, pentylphosphine, and the like, a phosphine compound or oxide compound such as methylphosphine oxide, ethylphosphine oxide, propylphosphine oxide, butylphosphine oxide, and the like, a diphenylphosphine compound, a triphenylphosphine compound, an oxide compound thereof, and the like, and a phosphonic acid. The organic ligand compound may be used alone or as a mixture of two or more compounds.

In an embodiment, the light emitting material may include a nano-sized inorganic phosphor. The nano-sized inorganic phosphor may be an inorganic phosphor having a size of less than or equal to about 500 nm, for example, about 10 nm to about 100 nm. As used herein, the term "nano-sized" refers to the case where the longest diameter of the given phosphor (i.e., the longest average diameter) is less than or equal to about 1 um. The size of the phosphor may be determined by scanning electron microscopy ("SEM") analysis of the given phosphor. For example, in the SEM image of the sampled phosphors, if the longest average diameter is less than or equal to about 1 um, the sampled phosphors may be determined as a nano-sized phosphor. The nano-sized inorganic phosphor may absorb light having a wavelength of about 200 nm or longer (e.g., in a range between about 200 nm to about 400 nm) to emit light of the visible light range. The composition of the nano-sized inorganic phosphor is not particularly limited and may have any known composition. In such an embodiment, the nano-sized inorganic phosphor may include a blue light emitting inorganic phosphor (e.g., $BaMg_2Al_{16}O_{27}:Eu^{2+}$), a green light emitting inorganic phosphor (e.g., $CeMgAl_{11}O_{19}:Tb^{3+}$), or a red light emitting inorganic phosphor (e.g., $Y_2O_3:Eu^{3+}$). In one embodiment, for example, the blue light emitting inorganic phosphor may include: $(Ba,Sr,Ca)_5(PO_4)_3(Cl,F,OH):Eu^{2+}$, $(Ba,Sr,Ca)MgAl_{10}O_{17}:Eu^{2+}$; or $(Ba,Sr,Ca)BPO_5:Eu^{2+}$. In one embodiment, for example, a blue-green light emitting inorganic phosphor may include: $Sr_4Al_{14}O_{25}:Eu^{2+}$; $BaAl_8O_{13}:Eu^{2+}$; $2SrO.0.84P_2O_5.0.16B_2O_3:Eu^{2+}$; $MgWO_4$; $BaTiP_2O_8$; $(Ba,Sr,Ca)MgAl_{10}O_{17}:Eu^{2+},Mn^{2+}$; or $(Ba,Sr,Ca)_5(PO_4)_3(Cl,F,OH):Sb^{3+}$. In one embodiment, for example, a green light emitting inorganic phosphor may include: $LaPO_4:Ce^{3+},Tb^{3+}$; $GdMgB_5O_{10}:Ce^{3+},Tb^{3+},Mn^{2+}$; or $GdMgB_5O_{10}:Ce^{3+},Tb^{3+}$. In one embodiment, for example, an yellow-orange light emitting inorganic phosphor may include $(Tb,Y,Lu,La,Gd)_3(Al,Ga)_5O_{12}:Ce^{3+}$, or $(Ba,Sr,Ca)_5(PO_4)_3(Cl,F,OH):Eu^{2+}, Mn^{2+}, Sb^{3+}$. In one embodiment, for example, the red light emitting inorganic phosphor may include: $(Y,Gd,La,Lu,Sc)_2O_3:Eu^{3+}$; $(Y,Gd,La,In,Lu,Sc)BO_3:Eu^{3+}$; $(Y,Gd,La)(Al,Ga)O_3:Eu^{3+}$; $(Ba,Sr,Ca)(Y,Gd,La,Lu)_2O_4:Eu^{3+}$; $(Y,Gd)Al_3B_4O_{12}:Eu^{3+}$; monoclinic $Gd_2O_3:Eu^{3+}$; $(Gd,Y)_4(Al,Ga)_2O_9:Eu^{3+}$; $(Ca,Sr)(Gd,Y)_3(Ge,Si)Al_3O_9:Eu^{3+}$; $(Sr,Mg)_3(PO_4)_2:Sn^{2+}$; $GdMgB_5O_{10}:Ce^{3+},Mn^{2+}$; or $3.5MgO.0.5MgF_2.GeO_2:Mn^{4+}$. However, the nano-sized inorganic phosphor is not limited to the material listed above. Methods of manufacturing such a nano-sized inorganic phosphor are known in the art.

In an embodiment, the light emitting material may include an organic dye. In such an embodiment, the organic dye may include an organic dye having light-emitting properties, and types thereof are not particularly limited. In one embodiment, for example, the organic dye may include an organic fluorescent dye and/or an organic phosphorescent dye. In one embodiment, for example, the organic dye may include an organic metal complex or an organic colorant. In an embodiment, the organic dye may include an organo-metal complex type dye such as tris(2-phenylpyridine)iridium, or an organic dye including an organic material such as coumarin, Rhodamine, phenoxazone, stilbene, terphenyl, and quarterphenyl, for example.

An embodiment of a method of preparing an optical element may include: preparing a first layer including an array defined by longitudinally aligned nanowires (e.g., metal nanowires) as dispersed in a first host matrix; and preparing a second layer including a light emitting material as dispersed in a second matrix to be in contact with a surface of the first layer.

In an embodiment, the preparation of the first layer and the second layer may be performed in any order. In such an embodiment, the first layer is prepared and then a second layer is prepared on a surface of the first layer, or vice versa.

The first layer may be prepared by dispersing the nanowires in the first host matrix to obtain a dispersion, applying an external magnetic field to the dispersion (for example, using a permanent magnet or electron magnet), and optionally drying the nanowires dispersed and aligned in the first host matrix. A solvent for the dispersion may be appropriately selected based on the types of the nanowires and the types of the first matrix. In one embodiment, for example, the solvent for the dispersion may be selected from water, alcohols (e.g., a C1 to C12 alcohol), a C1 to C15 aliphatic hydrocarbon (e.g., hexane or to heptane), a halogenated aliphatic hydrocarbon such as chloroform, and a C6 to C20 aromatic hydrocarbon (e.g., benzene, toluene, xylene, and the like). The dispersion may be placed between two magnets perpendicular to the longitudinal axis of the nanowires to apply external magnetism thereto, but not being limited thereto.

In one embodiment, for example, the second layer may be prepared by dispersing the light emitting material in the second host matrix and optionally drying the dispersion. The solvent for dispersing the light emitting material may be appropriately selected based on the types of the light emitting material and the types of the second host matrix. In one embodiment, for example, the solvent may be selected from water, alcohols (e.g., a C1 to C12 alcohol), a C1 to C15 aliphatic hydrocarbon (e.g., hexane or heptane), a halogenated aliphatic hydrocarbon such as chloroform, and a C6 to C20 aromatic hydrocarbon (e.g., benzene, toluene, xylene, and the like).

In such an embodiment, the nanowire, the first host matrix and the second host matrix are the same as the nanowire, the first host matrix and the second host matrix of embodiments of the optical element described above, and any repetitive detailed description thereof will be omitted.

In another embodiment, the method of preparing an optical element may include: preparing a layer including the nanowires (e.g., metal nanowires) and the light emitting material dispersed in a host matrix; and applying an external magnetic field to the layer including the nanowires and optionally drying the layer including the nanowires to provide an array of the nanowires longitudinally aligned in a predetermined direction.

Such an embodiment of the optical element may be used in a backlight unit, a color filter, or the like, in a non-emissive display.

Figure 16:
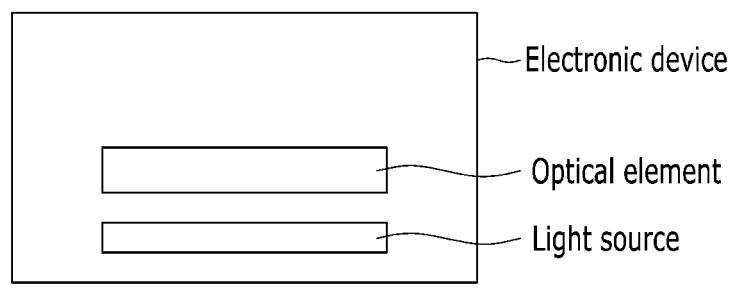
FIG. 16 is a view schematically illustrating an embodiment of an electronic device according to the invention.

FIG. 16 is a view schematically illustrating an embodiment of an electronic device according to the invention. In still another embodiment, an electronic device includes a light source and an optical element disposed in a path of light emitted from the light source. In such an embodiment, the optical element is substantially the same as embodiments of the optical element described above. Referring back to FIG. 1, in such an embodiment, the optical element may be disposed in the electronic device in such a manner that the light of a first wavelength (e.g., $\lambda_{pump}$) may excite the light emitting material to emit light of a second wavelength (e.g., $\lambda_{light\ emitting\ material}$) and the light of the second wavelength may pass through the array of the nanowires and thus may be linearly polarized. In one embodiment, for example, the light source may be placed on or over the second layer.

Figure 8:
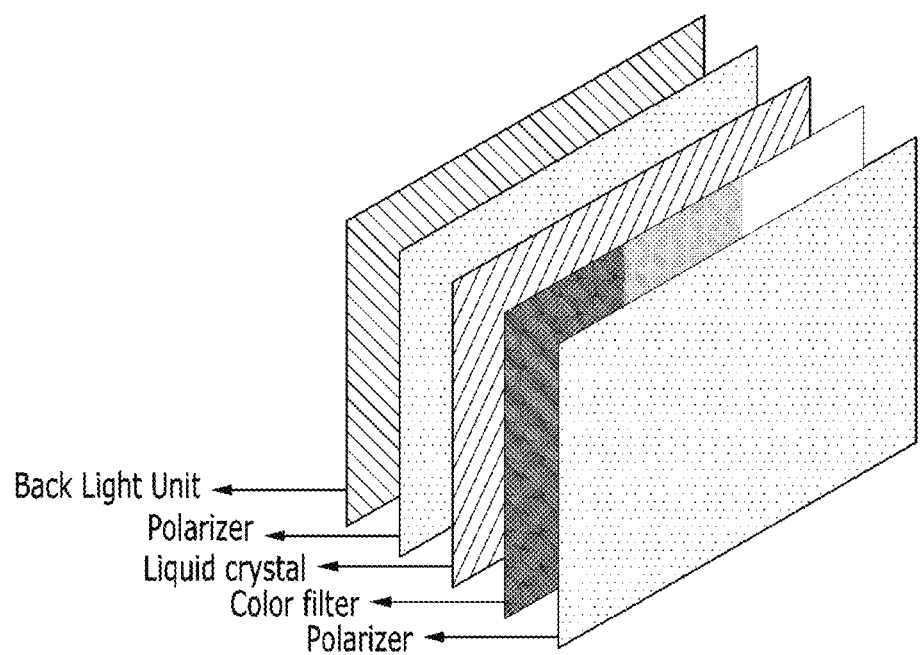
FIG. 8 is a view schematically illustrating a structure of an embodiment of an electronic device (in accordance with the invention.

The electronic device may be a light emitting diode, an organic light emitting diode, a solar cell electronic device, or a liquid crystal display, for example. In one embodiment, for example, the electronic device may be an LCD panel, as schematically illustrated in FIG. 8, but it is not limited thereto. Detailed structures of such an electronic device are known in the art, and any detailed description thereof will be omitted. An embodiment of the optical element according to the invention may be included in a wavelength conversion element, an element for polarization, a backlight unit, or the like, but it is not limited thereto.

Hereinafter, embodiments of the invention will be described in greater detail with reference to specific examples. However, the examples below are exemplary embodiments of the invention, and the invention is not limited thereto.

Example 1: Preparation of Multi-Segmented Nanowires

Using the Whatman Anodisc membrane as a template with a pore density of about $10^9$ per square centimeter ($cm^{-2}$), three-segment Au/Ni/Au nanowires having diameters of about 250 nm are plated by employing an electrodeposition method. Prior to the plating, a 200 nm thick silver layer serving as the working electrode is thermally evaporated on a back side of the membrane. As the counter electrode, mesh platinum is used while being placed 5 centimeters (cm) above the membrane inside an O-ring glass tube. The process starts with electrodeposition of silver using a silver bath (TechniSilver E-2, Italgalvano, 11.5% potassium silver cyanide) to clog the branching portion of the membrane. Then, for gold segments, the resulting membrane is placed in a gold electro-deposition bath (Orotemp 24, 6.87% potassium aurocyanide) and driven at a −1.6 milliampere (mA) current with a Versastat 3 potentiostat to deposit about 1.5 μm long Au segments. After rinsing with water, a −1.6 mA current is driven again to deposit nickel after the resulting membrane is placed in a nickel bath, which is composed of nickel sulfamate (20-35%), nickel bromide (0.5-1.5%), and boric acid (1-3%), to obtain 7 μm long nickel segments. The obtained membrane is removed from the nickel bath and rinsed with water. The final gold segments of about 1.5 μm in length are plated as in the first step following the rinsing. At these current levels, the average deposition rates of gold and nickel are confirmed to be 2 nanometers per second (nm/s) and 1.5 nm/s, respectively. Gold segments constitute about 3 μm, and the remaining portion of about 7 μm of the nanowire was nickel. After deposition, the silver backcoating is etched with a nitric acid solution ($HNO_3$ at 30%), and the alumina disc was dissolved in a sodium hydroxide solution (NaOH at 3 molar (M)) to obtain a segmented nanowire of Au/Ni/Au. The synthesized nanowires are dispersed in deionized water. Finally, the nanowires are centrifuged three times in deionized water at 3000 revolutions per minute (rpm) and stored while dispersed in deionized water.

The multi-segmented nanowires may suffer separation during the silver etching process. Therefore, a post-thermal baking process may be conducted to strengthen the Au/Ni interface and to enhance the bonding force between the Au segment and the Ni segment. The post-thermal baking process may be conducted by heating the membrane including the nanowires at a high temperature of about 250° C. for about 20 minutes.

Figure 3:
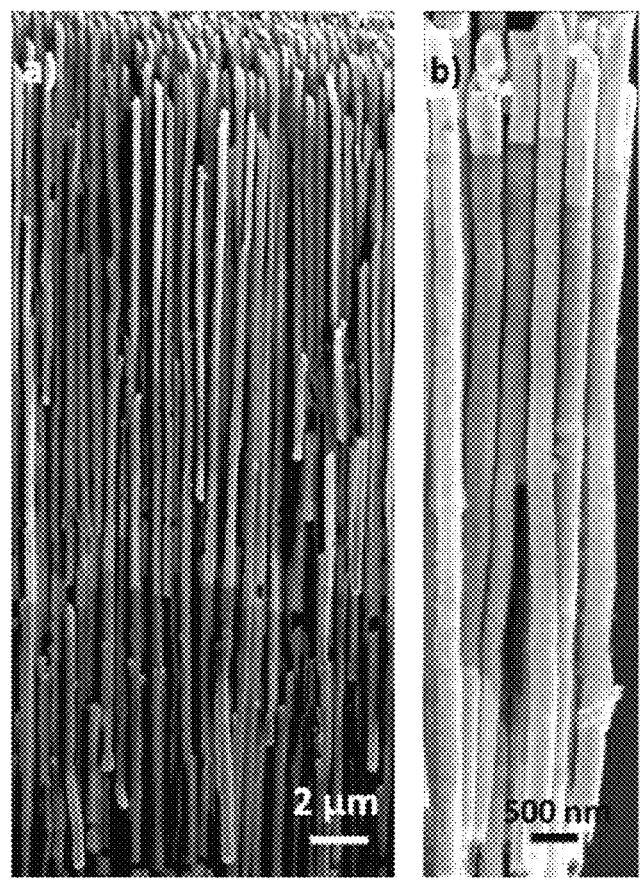
FIG. 3 is a microscopic image of the nanowires synthesized in Example 1.

The microscopic image of the multi-segmented nanowires prior to the removal of the alumina membrane and the microscopic image of the multi-segmented nanowires after the etching of the alumina membrane are shown in FIG. 3, from which the preparation of the multi-segmented Au/Ni/Au nanowires is confirmed.

Example 2: Preparation of the Film Including the Arrays of the Nanowires

Figure 4:
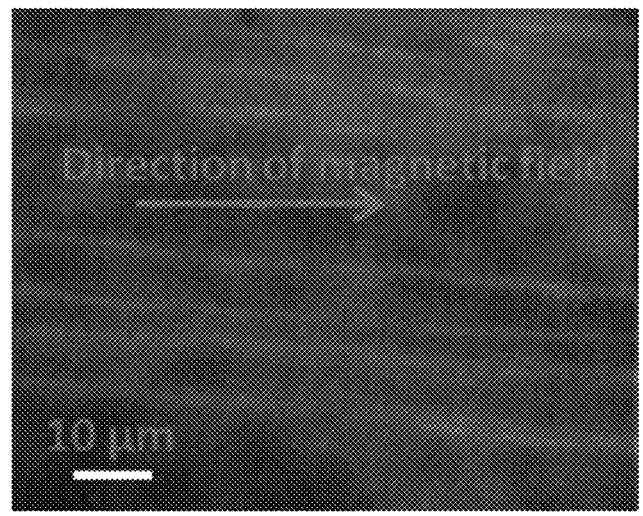
FIG. 4 is a microscopic image of an array of aligned nanowires prepared in Example 2.

The dispersion of multi-segmented nanowires in water (obtained from Example 1) is mixed with 750 microliter (μL) of a PVP solution (solvent:water), and the resulting mixture is drop-casted on a glass substrate and then dried at a room temperature under a magnetic field overnight to prepare a nanowire film including the arrays of nanowires dispersed therein. For a thin film having a thickness of about 200 μm (hereinafter, Film 1), 375 μL of the aqueous dispersion of the nanowires is used, while for a relatively thick film having a thickness of about 500 μm (hereinafter, Film 2), 500 μL of the aqueous dispersion of the nanowires is used. Two neodymium (Nd) permanent magnets having a size of 5 mm×10 mm×40 mm are used to apply a magnetic field of about 400 gauss. A microscopic image of the film including the arrays of the nanowires is shown in FIG. 4. FIG. 4 confirms that the nanowires are aligned substantially in the direction of the magnetic field and form a one-dimensional array. The film may include a plurality of the arrays, but their distribution is observed to be partially non-uniform within the film. A portion of the nanowires may form regular grid-like structures whilst extremely dense regions of the film may also be found. Furthermore, some parts of the films include a small number of nanowires in a small area. Due to the random nature of the alignment process, non-uniform regions may exist within the array or between the arrays. Notwithstanding, as clearly shown in the following results, such a hybrid structure including the aligned nanowires and the light emitting material (e.g., quantum dots) may still achieve reasonably high value of polarization.

Example 3: Simulation Experiments for Surface Plasmon Effect Between the Array of the Nanowires and the Quantum Dots When the array of the nanowires made of a material capable of showing surface plasmon coupling is irradiated with light emitted from the quantum dots, the intensity of light detected near the nanowires is analyzed by simulation in comparison with the array of the nanowires made of a material incapable of showing surface plasmon coupling. The results are shown in FIG. 9 and FIG. 10.

Figure 9:
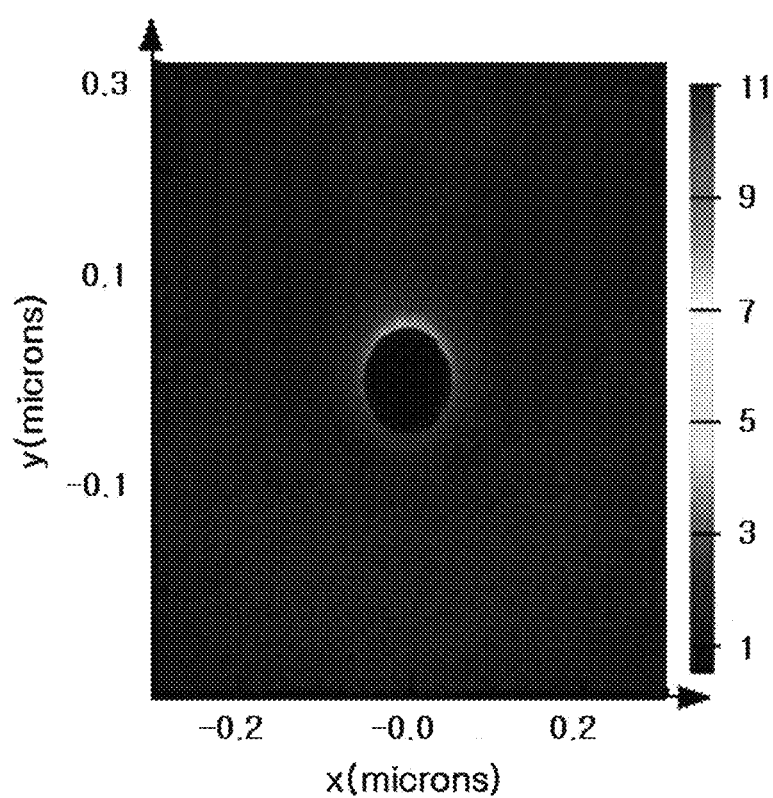
FIG. 9 and FIG. 10 are graphs showing the results of simulation conducted in Example 3.
Figure 10:
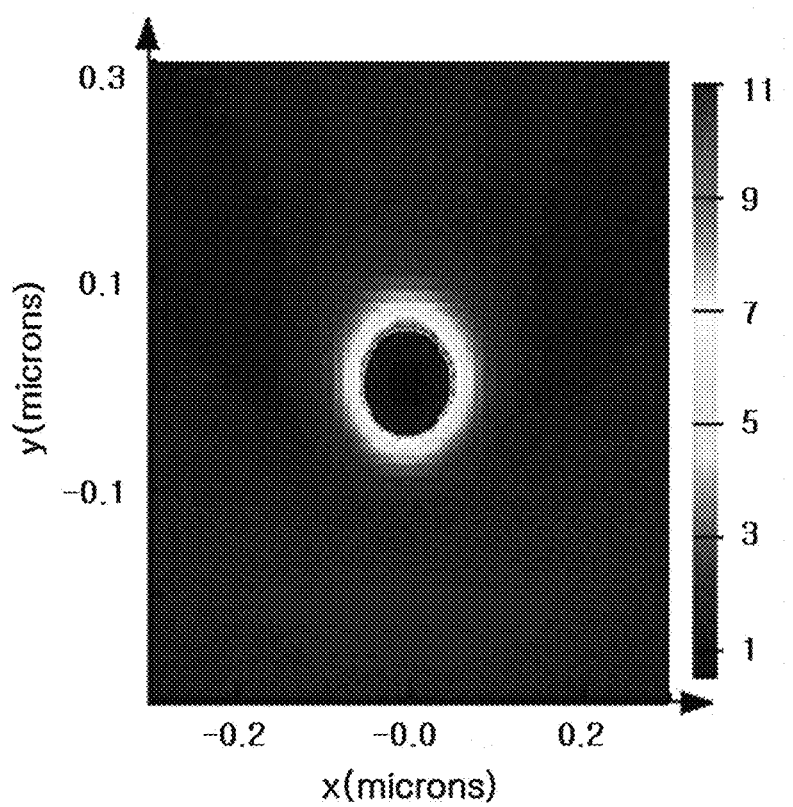

FIG. 9 shows the results for the nanowire with no surface plasmon, and FIG. 10 shows the results for the nanowire having surface plasmon. As shown in FIG. 9 and FIG. 10, the nanowires including the material capable of showing surface plasmon coupling may emit a higher intensity of light when the nanowires are irradiated with light.

Example 4: Simulation Experiment for Polarizing Effects of the Nanowires

Figure 13:
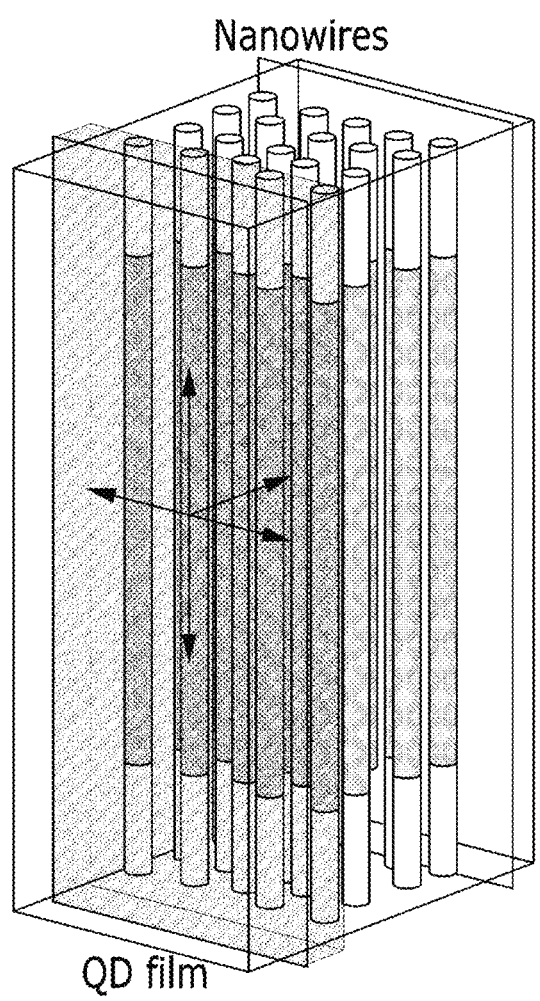
FIG. 13 is a view schematically illustrating a structure of an alternative embodiment of an optical element according to the invention.
Figure 14:
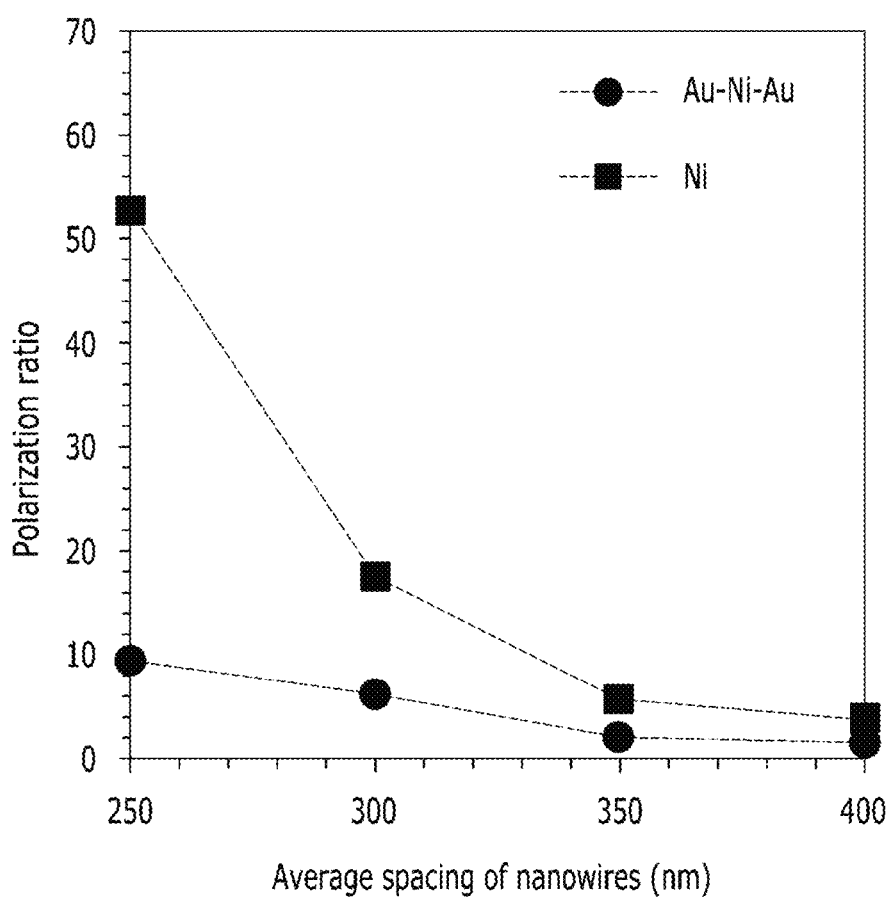
FIG. 14 and FIG. 15 are graphs showing the results of simulation conducted in Example 4.
Figure 15:
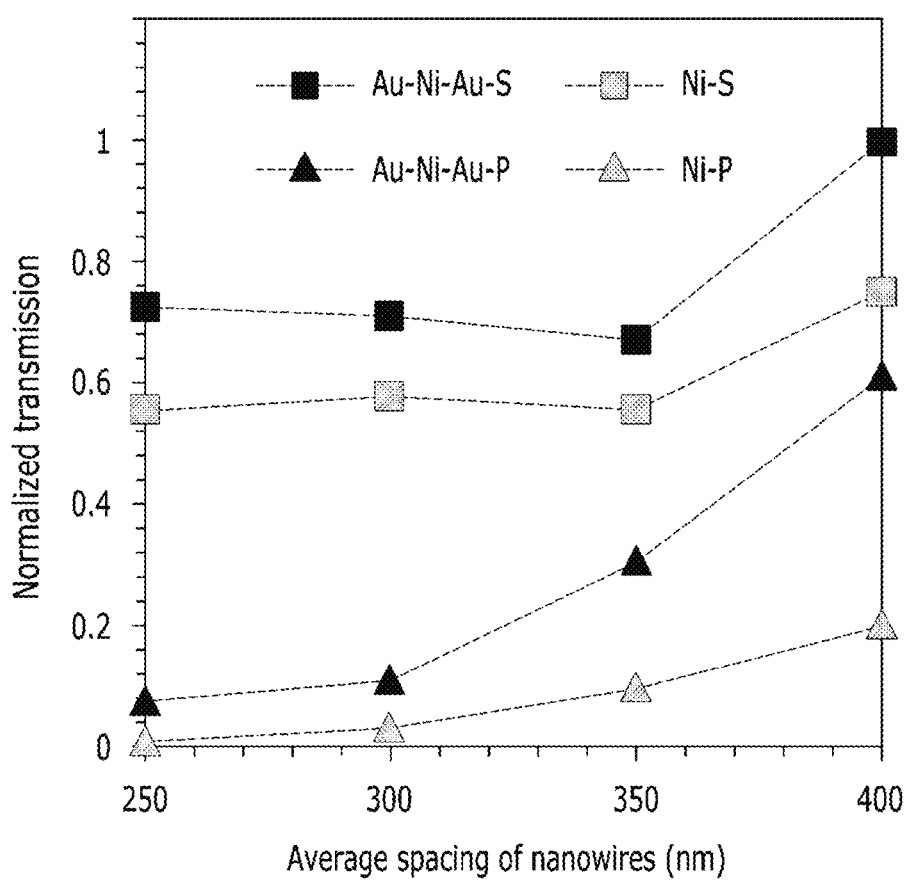

To investigate the potential of using the array of the nanowires thus prepared to generate polarized light from the quantum dots, the finite difference time domain ("FDTD") technique is utilized. In the simulation, single segment nanowires made of 10 μm long Ni and Au—Ni—Au three-segment nanowires having 1.5 μm long Au segments and 7 μm long Ni segments are used. The quantum dot layer is modeled using the real and imaginary parts of the refractive index as measured by optical ellipsometry. In the FDTD simulations, the optical element has a structure as shown in FIG. 13 and light emitted by the quantum dot film QD film is assumed to pass through the aligned nanowire network, each of which are randomly positioned nanowires having average nanowire-to-nanowire separation of 250 nm, 300 nm, 350 nm, and 400 nm. Such a randomly distributed nanowire matrix is along the lateral plane to account for the very large area of the sample that may be up to a few square centimeters. Separate investigation is made for the parallel and perpendicular polarization that is emitted by the quantum dots, and the transmitted power for these two orthogonal polarizations is monitored. The results are shown in FIG. 14 and FIG. 15.

The emission peak of the quantum dots is about 650 nm. In FIG. 14, numerical simulation results indicate the ratio of s- and p-polarizations (i.e., s- and p-polarized light) transmitted through the nanowires (Au/Ni/Au and Ni nanowires) at the emission peak of quantum dots, about 650 nm. FIG. 15 shows normalized transmitted intensities through Au/Ni/Au and Ni nanowires at the emission peaks of quantum dots for s- and p-polarizations.

Along the longitudinal direction of the nanowires, parallel polarized electric field components of the emitted light experiences a conductive medium and is absorbed/scattered. On the other hand, perpendicular polarized electric field components of the emitted light interacts much less with the aligned to nanowires; thus, more perpendicular polarized light is transmitted. The results of the simulations were presented in FIG. 14 and FIG. 15. According to these results, aligned Au/Ni/Au and Ni nanowires exhibit an anisotropic characteristic (i.e., increasing s/p ratio for the transmission) that is enhanced as the inter-nanowire distance is decreased. In the case of Au/Ni/Au nanowires, it is possible to achieve polarization ratios of greater than about 10 with an inter-nanowire distance that is smaller than 250 nm. In the case of Ni nanowires, higher polarization ratios may be achieved.

Example 5: Production of Optical Element Including the Array of Nanowires and Quantum Dots I CdTe quantum dots are synthesized according to the following manner.

4.59 grams (g) of $Cd(ClO_4)_2 \cdot 6H_2O$ is dissolved in 0.5 liter (L) of Milli-Q water to prepare a solution, to which 1.33 g of thioglycolic acid ("TGA") is added. Then, by the addition of NaOH thereto, the resulting mixture of pH 12 is prepared as a Cd-containing solution. Argon gas is flowed into 0.8 g of $Al_2Te_3$ for about one hour to completely remove air therefrom, and 0.5 M $H_2SO_4$ is added to the $Al_2Te_3$, providing a $H_2Te$ gas. The $H_2Te$ gas thus prepared is reacted with the Cd-containing solution at about 100° C. for 20 hours to obtain a CdTd solution including CdTe quantum dots dispersed in water.

1600 microliters (μL) of the CdTe solution thus obtained is mixed with 1200 μL of a PVP solution (concentration: 42.4 mg/ml, solvent:water), and the resulting mixture is drop-casted on Film 1 and Film 2 prepared in Example 2, respectively, and then is dried at a room temperature overnight to prepare the optical element.

Example 6: Production of Optical Element Including the Array of Nanowires and Quantum Dots II The aqueous dispersion of the nanowires prepared in Example 1 is mixed with 750 μL of the PVP solution (solvent:water). The resulting solution is mixed with a solution prepared by mixing 1600 μL of the CdTe solution prepared as in Example 3 and 750 μL of the PVP solution. The resulting mixture is drop-casted onto a glass substrate and dried under a magnetic field at room temperature overnight to obtain a nanowire film including CdTe quantum dots and the arrays of the nanowires dispersed in the polymer matrix. Two neodymium (Nd) permanent magnets having a size of 5 mm×10 mm×40 mm are used to apply a magnetic field of about 400 gauss.

Figure 5:
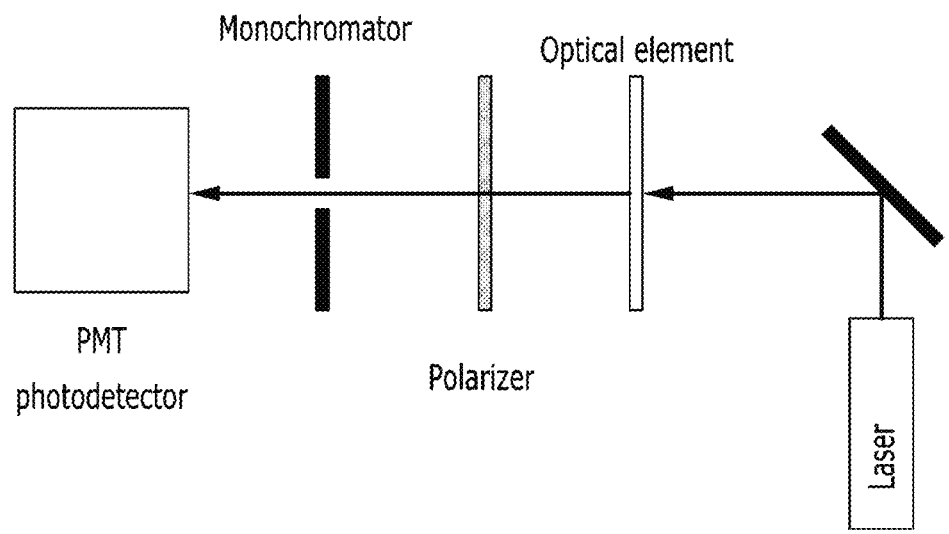
FIG. 5 schematically shows equipment used for measuring a polarization degree of light emitted from the optical element in Example 4.

Example 7: Measurement of Emission Properties (Polarization Degree) of the Optical Element Thus Prepared The polarization degree of the light emitted from the optical element of Example 3 is measured using the equipment schematically shown in FIG. 5 as below.

The optical element is irradiated using a laser diode that emits light at 375 nm. Light emitted by the optical element is collected through a linear polarizer, a monochromator and a photomultiplier tube, and analyzed with a photomultiplier ("PMT") photodetector. For the light emitted from the optical element, the s-polarization (the component of light in a direction perpendicular to the aligned direction of the nanowires) and the p-polarization (the component of light in a direction parallel to the aligned direction of the nanowires) are measured over the wavelengths, respectively.

Figure 6:
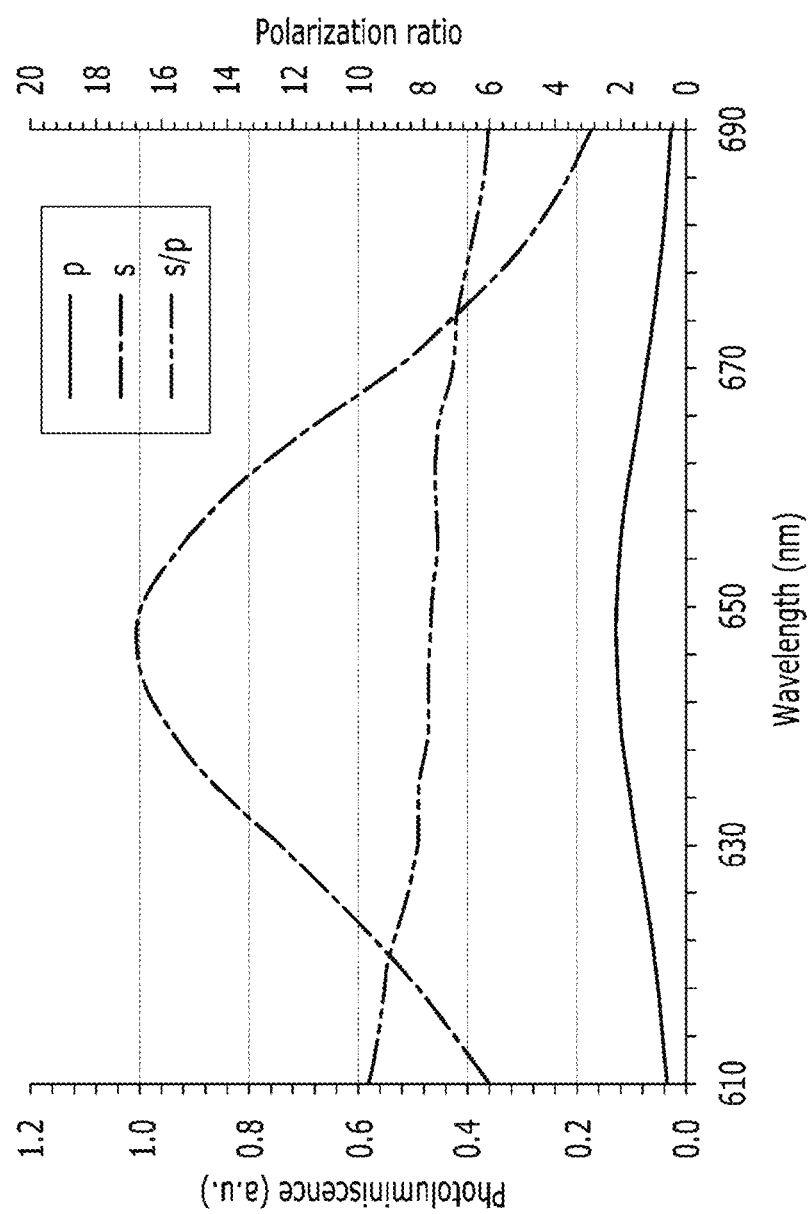
FIG. 6 and FIG. 7 are graphs, each showing three curves plotting p-polarization, s-polarization, and a ratio of s/p over the wavelength of the light emitted from the optical element including Film 1 and Film 2, respectively, prepared in Example 3.
Figure 7:
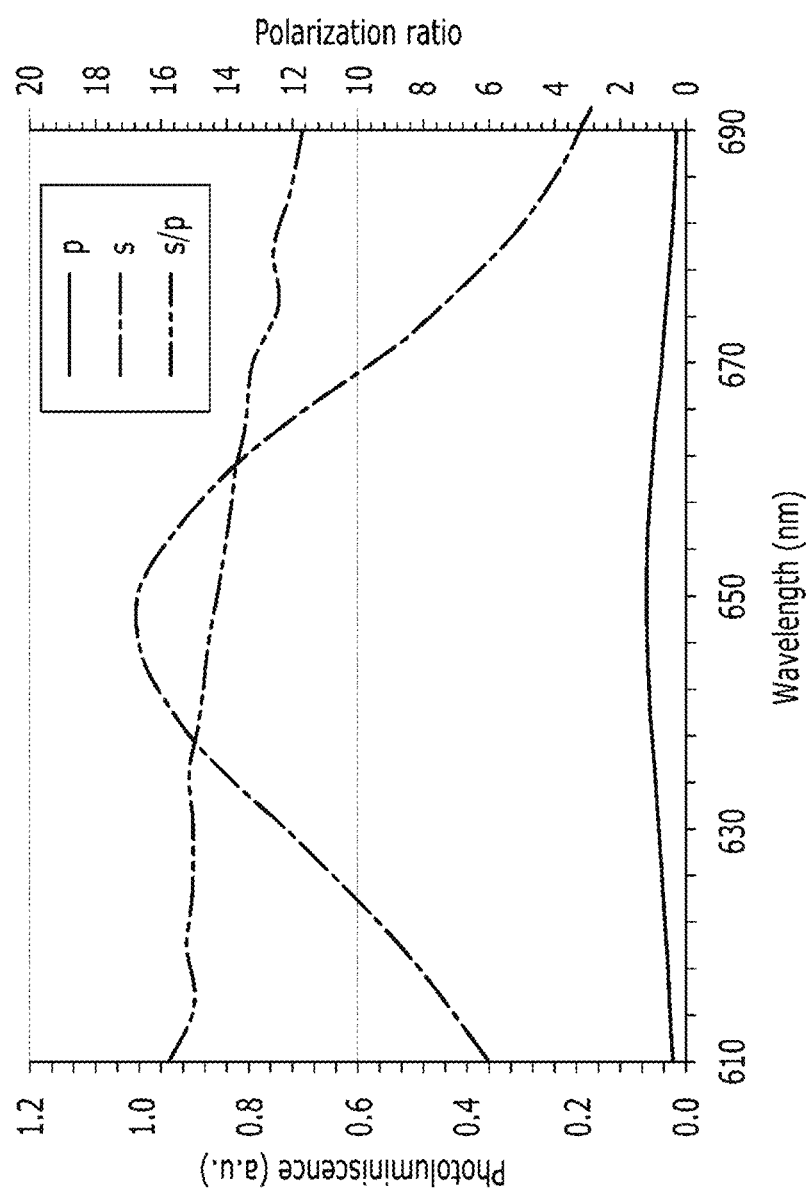

The results are shown in FIG. 6 (for the optical element including Film 1) and FIG. 7 (for the optical element including Film 2), respectively.

When the ratio of the s-polarization to p-polarization (i.e., the polarization ratio: s/p) is calculated with respect to the overall wavelengths, the polarization ratio (s/p) of the optical element including Film 1 is about 10 (which is converted into a polarization degree of 0.82, (10−1)/(10+1)=0.82), while the polarization ratio (s/p) of the optical element including Film 2 is about 15 (which is converted into a polarization degree of 0.88, (15−1)/(15+1)=0.88). The film including CdTe quantum dots dispersed in the PVP has a polarization ratio (s/p) of about 1.

The results of the polarization ratio (s/p) and FIG. 6 and FIG. 7 confirm that the optical element prepared from Example 3 may emit polarized light. Accordingly, an embodiment of a light source including the optical element according to the invention may be used to emit the polarized light as described above, and may be used as a light source of an electronic device using polarized light via a polarizer.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optical element, comprising:
a film comprising a first host matrix and a plurality of nanowire arrays dispersed in the first host matrix, each of the nanowire arrays comprising a plurality of nanowires dispersed in the first host matrix and at least two of the plurality of nanowire arrays being arranged along a longitudinal direction of the plurality of nanowires; and
a light emitting material disposed on the nanowires,
wherein the plurality of nanowires in each of the nanowire arrays are longitudinally aligned in the nanowire array to linearly polarize at least a portion of light emitted from the light emitting material, and
wherein the plurality of nanowire arrays is fully surrounded by the first host matrix, the first host matrix consists of a transparent and insulative polymer,
wherein an average of lengths of the plurality of nanowires is greater than or equal to about 3 μm and less than or equal to about 500 μm, and
wherein at least one of the plurality of nanowires comprises a first metal segment having magnetism and a second metal segment capable of causing surface plasmon resonance, the second metal segment is immediately next to the first metal segment.

2. The optical element of claim 1, wherein the at least one of the plurality of nanowires comprises another first metal segment, and wherein the second metal segment is disposed between the first metal segment and the another first metal segment and interfaces the first metal segment and the another first metal segment.

3. The optical element of claim 1, wherein the nanowires comprise a magnetic nanowire.

4. The optical element of claim 1, wherein
the first metal segment comprises nickel, cobalt, iron, oxidized iron, or a combination thereof, and
the second metal segment comprises gold, silver, copper, platinum, or a combination thereof.

5. The optical element of claim 1, wherein the nanowire has a diameter of less than or equal to about 300 nanometers and an aspect ratio of greater than or equal to about 10.

6. The optical element of claim 1, wherein the array of the nanowires has a single layer structure or a multi-layer structure.

7. The optical element of claim 1, wherein the light emitting material comprises a semiconductor nanocrystal, a nano-sized inorganic phosphor, or a combination thereof.

8. The optical element of claim 1, wherein
the light emitting material comprises a quantum dot having a diameter in a range of about 2 nanometers to 10 nanometers,
wherein the quantum dot absorbs light of a wavelength between about 300 nanometers to about 700 nanometers and emits light of a wavelength between about 400 nanometers to about 700 nanometers.

9. The optical element of claim 1, wherein the light emitting material absorbs light of a wavelength between about 300 nanometers to about 650 nanometers and emits light of a wavelength between about 450 nanometers to about 660 nanometers.

10. The optical element of claim 1, wherein the light emitting material is coated with a polymer or a metal oxide.

11. The optical element of claim 7, wherein the light emitting material comprises the semiconductor nanocrystal comprising a Group II-VI compound, a Group III-V compound, a Group IV-VI compound, a Group IV element, a Group IV compound, or a combination thereof.

12. The optical element of claim 7, wherein the light emitting material has a core-shell structure.

13. The optical element of claim 1, wherein the first host matrix comprises a transparent polymer selected from a group consisting of polyvinylpyrrolidone, polyethylene, polyacrylate, polypropylene, poly(butyl methacrylate), a copolymer thereof, and a combination thereof.

14. The optical element of claim 1, wherein the film includes a region having an alignment of the nanowires not uniform within the nanowire array or between the arrays.

15. The optical element of claim 1, wherein the optical element has a layered structure comprising:
a first layer; and
a second layer contacting a surface of the first layer,
wherein the first layer comprises the first host matrix and the array of the nanowires dispersed in the first host matrix, and
the second layer comprises a second host matrix and the light emitting material dispersed in the second host matrix.

16. The optical element of claim 15, wherein the first and second host matrix comprises a transparent polymer.

17. The optical element of claim 1, wherein the light emitting material is disposed adjacent to the array of the nanowires such that at least a portion of the light emitted from the light emitting material couples with surface plasmons of the nanowires.

18. The optical element of claim 1, further comprising:
a transparent substrate,
wherein the nanowires are disposed on the transparent substrate.

19. The optical element of claim 18, wherein the transparent substrate is flexible.

20. An electronic device comprising:
a light source which emits light; and
an optical element which receives the light from the light source,
wherein the optical element comprises: a film comprising a first host matrix and a plurality of nanowire arrays dispersed in the first host matrix, each of the nanowire arrays comprising a plurality of nanowires dispersed in the first host matrix and at least two of the plurality of nanowire arrays being arranged along a longitudinal direction of the plurality of nanowires; and
a light emitting material disposed on the nanowires,
wherein the plurality of nanowires in each of the nanowire arrays are longitudinally aligned in the nanowire array to linearly polarize at least a portion of light emitted from the light emitting material, and
wherein the plurality of nanowire arrays is fully surrounded by the first host matrix and the first host matrix consists of a transparent and insulative polymer,
wherein an average of lengths of the plurality of nanowires is greater than or equal to about 3 μm and less than or equal to about 500 μm, and
wherein at least one of the plurality of nanowires comprises a first metal segment having magnetism and a second metal segment capable of causing surface plasmon resonance, the second metal segment is immediately next to the first metal segment.

21. The electronic device of claim 20, wherein
the optical element receives the light from the light source such that the light emitted from the light source and having a first wavelength excites the light emitting material to emit light having a second wavelength, and the light having the second wavelength passes through the array of the nanowires and is linearly polarized.

22. The electronic device of claim 20, wherein at least one of the plurality of nanowires comprises another first metal segment, and wherein the second metal segment is disposed between the first metal segment and the another first metal segment and interfaces the first metal segment and the another first metal segment.

23. The electronic device of claim 20, wherein
the first metal segment comprises nickel, cobalt, iron, oxidized iron, or a combination thereof, and
the second metal segment comprises gold, silver, copper, platinum, or a combination thereof.

24. The electronic device of claim 20, wherein the nanowire has a diameter of less than or equal to about 300 nanometers and an aspect ratio of greater than or equal to about 10.

25. The electronic device of claim 20, wherein the array of the nanowires has a single layer structure or a multi-layer structure.

26. The electronic device of claim 20, wherein
the light emitting material comprises a semiconductor nanocrystal, and
the semiconductor nanocrystal comprises a Group II-VI compound, a Group III-V compound, a Group IV-VI compound, a Group IV compound, or a combination thereof and has a core-shell structure.

27. The electronic device of claim 20, wherein
the optical element has a layered structure comprising:
a first layer; and
a second layer contacting a surface of the first layer,
the first layer comprises the first host matrix and the array of the nanowires dispersed in the first host matrix, and
the second layer comprises a second host matrix and the light emitting material dispersed in the second host matrix.

28. The electronic device of claim 20, wherein the electronic device is a light emitting diode, an organic light emitting diode, a sensor, a photovoltaic electronic device, or a liquid crystal display.

29. The electronic device of claim 20, wherein the first host matrix comprises a transparent polymer selected from a group consisting of polyvinylpyrrolidone, polyethylene, polyacrylate, polypropylene, poly(butyl methacrylate), a copolymer thereof, and a combination thereof.

30. The electronic device of claim 20, wherein the film includes a region having an alignment of the nanowires not uniform within the nanowire array or between the nanowire arrays.

* * * * *